United States Patent
Wunderlich et al.

(10) Patent No.: US 11,740,268 B2
(45) Date of Patent: Aug. 29, 2023

(54) PREDICTIVE ZERO PHASE FILTERING

(71) Applicant: University of South Carolina, Columbia, SC (US)

(72) Inventors: Andrew S. Wunderlich, Columbia, SC (US); Enrico Santi, Chapin, SC (US)

(73) Assignee: University of South Carolina, Columbia, SC (US)

(*) Notice: Subject to any disclaimer, the term of this patent is extended or adjusted under 35 U.S.C. 154(b) by 227 days.

(21) Appl. No.: 17/235,422

(22) Filed: Apr. 20, 2021

(65) Prior Publication Data
US 2021/0341522 A1 Nov. 4, 2021

Related U.S. Application Data

(60) Provisional application No. 63/018,588, filed on May 1, 2020.

(51) Int. Cl.
*G01R 23/167* (2006.01)
*G06N 5/04* (2023.01)
*G06N 20/00* (2019.01)
*H02J 7/00* (2006.01)

(52) U.S. Cl.
CPC .......... *G01R 23/167* (2013.01); *G06N 5/04* (2013.01); *G06N 20/00* (2019.01); *H02J 7/0048* (2020.01)

(58) Field of Classification Search
CPC ........ G01R 23/167; G06N 5/04; G06N 20/00; H02J 7/0048; H02J 3/32
See application file for complete search history.

(56) References Cited

U.S. PATENT DOCUMENTS

| | | | |
|---|---|---|---|
| 7,450,036 B2* | 11/2008 | Azizi | H03H 17/0416 341/61 |
| 10,339,421 B2* | 7/2019 | Mei | G06V 10/764 |
| 10,372,089 B2* | 8/2019 | Azuma | G05B 13/04 |
| 10,962,936 B2* | 3/2021 | Lim | G05B 13/021 |
| 2017/0278513 A1* | 9/2017 | Li | G10L 15/20 |

OTHER PUBLICATIONS

Marin et al. (Real-time power angle determination of salient-pole synchronous machine based on air gap measurements, 2008) (Year: 2008).*

(Continued)

*Primary Examiner* — Mohammad K Islam
(74) *Attorney, Agent, or Firm* — Burr & Forman LLP; Jeffrey H. Kamenetsky

(57) ABSTRACT

Systems, apparatuses, methods and computer processes to separate and select frequency components of a signal in real time without phase delay by predicting or forecasting future values of the signal and using that forecast and past measurements in a noncausal zero-phase filtering algorithm are provided. The method of separating and selecting frequency components of a signal in real time without phase delay using a zero-phase filter, comprises obtaining past measurements of the signal; obtaining predicted values of the signal; and using the predicted values of the signal and the past measurements of the signal as components of an input signal in a noncausal zero-phase filtering algorithm for a zero-phase filter, the zero-phase filter producing an output signal.

16 Claims, 8 Drawing Sheets

(56) References Cited

OTHER PUBLICATIONS

Kung(Recitation 7: Introduction to Filtering, Nov. 21, 2019) (Year: 2019).*
Anand (estimation of signals in colored non gaussian noise based on gaussian mixture models, 2007) (Year: 2007).*
Tan (Non-causal Zero Phase FIR Filter With Examples, 2006) (Year: 2006).*
Akgul (The z-transform and Analysis of LTI Systems, 2004). (Year: 2004).*
Adnane(Noncausal forward/backward two-pass IIR digital filters in real time, 2011). (Year: 2011).*
Bao (Design Enhancements in Repetitive and Iterative Learning Control, 2010). (Year: 2010).*

* cited by examiner

PREDICTIVE ZERO PHASE FILTERING

CROSS REFERENCE TO RELATED APPLICATION

This application claims priority to U.S. Provisional Patent Application No. 63/018,588, filed on May 1, 2020, entitled Predictive Zero Phase Filtering, the disclosure of which is incorporated by reference.

BACKGROUND OF THE INVENTION

1) Field of the Invention

The present disclosure relates to systems, apparatuses, methods and computer processes to separate and select frequency components of a signal in real time without phase delay by predicting or forecasting future values of the signal and using that forecast and past measurements in a noncausal zero-phase filtering algorithm.

2) Description of Related Art

Real-time separation of frequency content is a frequent interest in applications of power electronics and other areas of electrical engineering. Accordingly, it is an object of the present disclosure to provide systems, apparatuses, methods, and computer processes to separate and select frequency components of a signal in real time without phase delay by predicting or forecasting future values of the signal and using that forecast and past measurements in a noncausal zero-phase filtering algorithm.

SUMMARY OF THE INVENTION

In accordance with one aspect of the present disclosure, a method of separating and selecting frequency components of a signal in real time without phase delay using a zero-phase filter is provided. In one embodiment of this aspect, the method includes, obtaining past measurements of the signal, obtaining predicted values of the signal, using the predicted values of the signal and the past measurements of the signal as components of an input signal in a noncausal zero-phase filtering algorithm for a zero-phase filter, the zero-phase filter producing an output signal.

In another embodiment, the predicted values of the signal are obtained using machine learning methods. In another embodiment, the method further includes sampling the signal in a time range from $-T_{window}$ to $T_{window}$ where $T_0$ is the present time and $T_{window}$ is related to an inverse of a cutoff frequency of the zero-phase filter. In another embodiment, obtaining past measurements of the signal includes sampling the signal between a first time instant $-T_{window}$ and a second time instant $T_0$, and obtaining predicted values of the signal in the time range between the second time instant $T_0$ and a third time instant $T_{window}$.

In another embodiment, the method further includes performing, by the zero phase filter, a first filtering function on the input signal resulting in a first filtered input signal, performing a first time reversal function on the first filtered input signal resulting in a first time reversal input signal, performing a second filtering function on the first time reversal input signal resulting in a second filtered input signal, and performing a second time reversal function of the second filtered input signal resulting in the output signal, the resulting output signal being a filtered waveform. In another embodiment, the method further includes updating the output signal by selecting a single value of the filtered waveform which corresponds to the current time.

In accordance with another aspect of the disclosure, an apparatus for separating and selecting frequency components of an input signal in real time without phase delay is provided. The apparatus includes a zero-phase filter, the filter including an input component for receiving the input signal, a filtering component, and a time reversal component. The apparatus further include a processing component configured to obtain past measurements of a signal, obtain predicted values of the signal, and use the predicted values of the signal and the past measurements of the signal as components of the input signal to the filtering component, the filtering component producing an output signal.

In one embodiment of this aspect, the predicted values of the signal are obtained using machine learning methods. In one embodiment of this aspect, the processing component is further configured to sample the input signal in a time range from $-T_{window}$ to $T_{window}$ where $T_0$ is the present time and $T_{window}$ is related to an inverse of a cutoff frequency of the filtering component. In another embodiment, obtaining past measurements of the signal includes sampling the signal between a first time instant $-T_{window}$ and a second time instant $T_0$, and obtaining predicted values of the signal in a time range between the second time instant $T_0$ and a third time instant $T_{window}$.

In another embodiment, the filtering component includes a first filtering component and a second filtering component, and the time reversal component includes a first time reversal component and a second time reversal component, wherein the first filtering component is configured to perform a first filtering function on the input signal resulting in a first filtered input signal, the first time reversal component is configured to perform a first time reversal function on the first filtered input signal resulting in a first time reversal input signal, the second filtering component is configured to perform a second filtering function on the first time reversal input signal resulting in a second filtered input signal, and the second time reversal component is configured to perform a second time reversal function of the second filtered input signal resulting in the output signal, the output signal having a filtered waveform. In another embodiment, the processing component is further configured to update the output signal by selecting a single value of the filtered waveform which corresponds to the current time.

In accordance with another aspect of the disclosure, a non-transitory computer-readable storage medium having stored therein instructions which, when executed by a processor, cause the processor to separate and select frequency components of a signal in real time without phase delay using a zero-phase filter. The processor is further configured to perform operations including obtaining past measurements of the signal, obtaining predicted values of the signal, and using the predicted values of the signal and the past measurements of the signal as components of an input signal in a noncausal zero-phase filtering algorithm for a zero-phase filter, the zero-phase filter producing an output signal.

In another embodiment of this aspect, the predicted values of the signal are obtained using machine learning methods. In another embodiment, the processor is further configured to sample the signal in a time range from $-T_{window}$ to $T_{window}$ where $T_0$ is the present time and $T_{window}$ is related to an inverse of a cutoff frequency of the zero-phase filter. In another embodiment, obtaining past measurements of the signal includes sampling the signal between a first time instant $-T_{window}$ and a second time instant $T_0$, and obtaining predicted values of the signal in the time range between the second time instant $T_0$ and a third time instant $T_{window}$.

BRIEF DESCRIPTION OF THE DRAWINGS

The construction designed to carry out the disclosure will hereinafter be described, together with other features thereof. The disclosure will be more readily understood from a reading of the following specification and by reference to the accompanying drawings forming a part thereof, wherein an example of the disclosure is shown and wherein.

Figure 1:
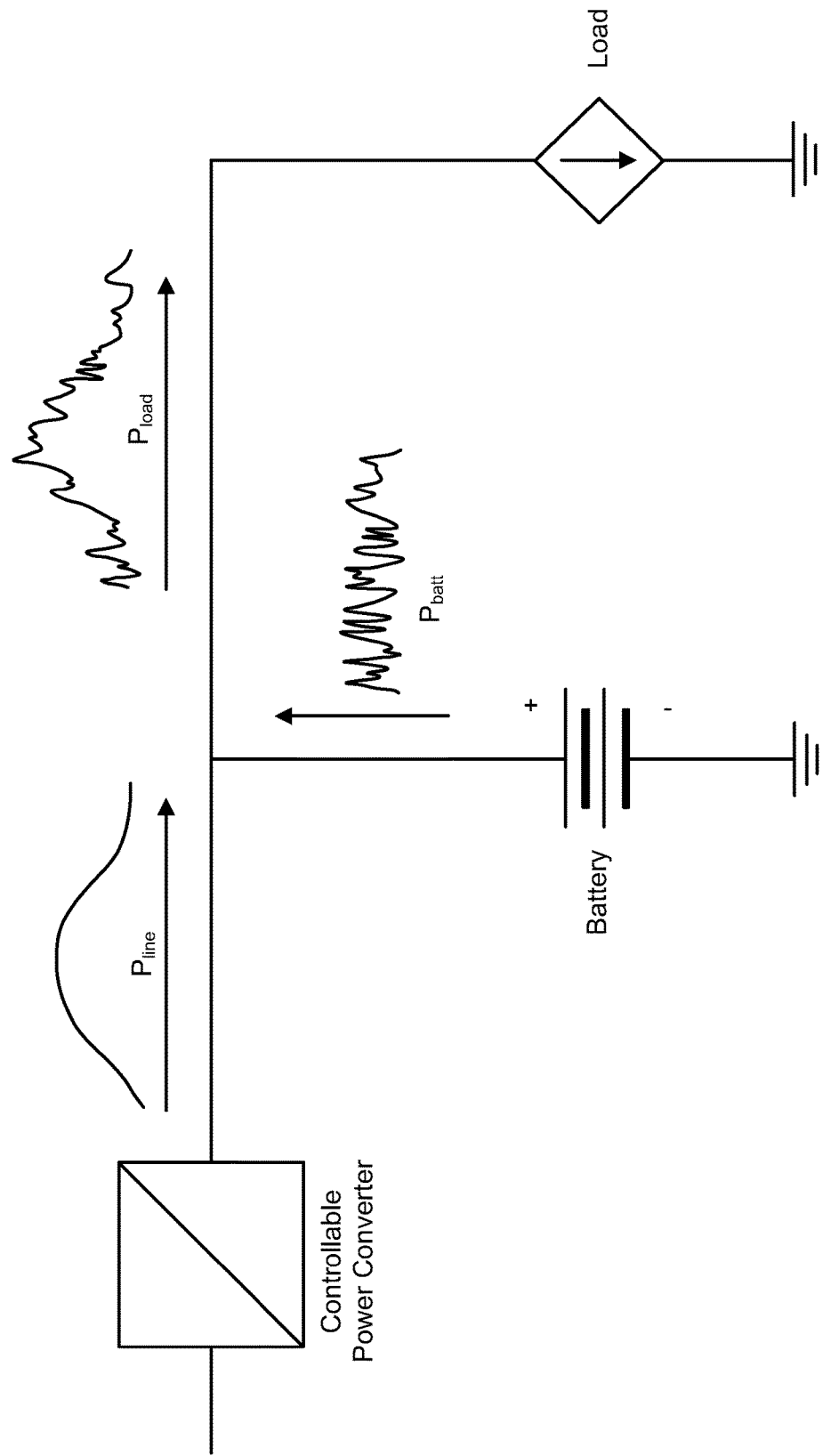
FIG. 1 illustrates how local energy storage decouples power transients from the network so that only the slow-moving "average" power is delivered by the network.

It will be understood by those skilled in the art that one or more aspects of this disclosure can meet certain objectives, while one or more other aspects can meet certain other objectives. Each objective may not apply equally, in all its respects, to every aspect of this disclosure. As such, the preceding objects can be viewed in the alternative with respect to any one aspect of this disclosure. These and other objects and features of the disclosure will become more fully apparent when the following detailed description is read in conjunction with the accompanying figures and examples. However, it is to be understood that both the foregoing summary of the disclosure and the following detailed description are of a preferred embodiment and not restrictive of the disclosure or other alternate embodiments of the disclosure. In particular, while the disclosure is described herein with reference to a number of specific embodiments, it will be appreciated that the description is illustrative of the disclosure and is not constructed as limiting of the disclosure. Various modifications and applications may occur to those who are skilled in the art, without departing from the spirit and the scope of the disclosure, as described by the appended claims. Likewise, other objects, features, benefits and advantages of the present disclosure will be apparent from this summary and certain embodiments described below, and will be readily apparent to those skilled in the art. Such objects, features, benefits and advantages will be apparent from the above in conjunction with the accompanying examples, data, figures and all reasonable inferences to be drawn therefrom, alone or with consideration of the references incorporated herein.

DETAILED DESCRIPTION OF A PREFERRED EMBODIMENT

With reference to the drawings, the disclosure will now be described in more detail. Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are herein described.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

All patents, patent applications, published applications, and publications, databases, websites and other published materials referred to throughout the entire disclosure herein, unless noted otherwise, are incorporated herein by reference in their entirety.

The current disclosure provides systems and methods to separate and select frequency components of a signal in real time without phase delay by predicting or forecasting future values of the signal and using that forecast and past measurements in a noncausal zero-phase filtering algorithm. To the extent that the predicted future values of the signal are accurate, the disclosed algorithm can provide perfect low-pass, high-pass, or even band-pass filtering in real time without any phase distortion or delays. Results also show that imperfect signal prediction can still ultimately provide better real-time filtering performance than traditional causal filtering in certain applications.

This disclosure expands the scope of valuable signal processing techniques, which were previously only usable for post-processing data which had been previously collected and stored. This disclosure allows the signal processing technique to be implemented on real-time data as it is collected, making it valuable for many real-time control system applications. One example application is an intelligent battery system for home power. The current disclosure leads to a dramatically better real-time control system which uses much less of the batteries stored energy reserves throughout the day, thereby reducing the required battery capacity and extending the useful lifetime of the battery.

Real-time separation of frequency content is a frequent interest in applications of power electronics and other areas of electrical engineering. Potential applications of this disclosure include, but are not limited to: (1) improved utilization of energy storage resources in a dynamic load smoothing application; (2) improved control of a hybrid energy storage solution featuring batteries and supercapacitors; (3) optimized scheduling of utility generators; and (4) a harmonic compensator for improved power quality in the presence of variable nonlinear loads.

There are several potential applications of this technology. For example, in an intelligent home battery system, the present disclosure allows for significantly better utilization of the installed battery's energy stores. This leads to a smaller required battery for a given installation and decreased stress and a longer useful lifetime of the installed battery. The combined result is a significant cost reduction and increased financial viability of the system. This disclosure can be applied to a power delivery network in which a time-varying power source or a load is decoupled from the rest of the network by local energy storage resources such as batteries or supercapacitors. In this way, the energy storage is used to supply or accept short-duration power transients from the source or load, and the network must only transmit the slow-moving average power that is generated or consumed by the node. This can significantly reduce the peak power rating of the power delivery network and the required power bandwidth of the proposed power delivery network.

FIG. 1 shows a typical setup in which a time-varying load is connected to an energy storage element and to a power distribution network through a controllable power converter. FIG. 1 illustrates how local energy storage decouples power transients from the network so that only the slow-moving "average" power is delivered by the network. Note that, for simplicity, the rest of this document will refer only to electrical loads, with the understanding that the disclosure is equally applicable to time-varying electrical sources and that power bidirectional hybrid source/loads are also possible.

Well-designed algorithms are required for managing power delivery and maintaining an acceptable state of charge (SoC) on the energy storage element. A simple approach to removing transients from the network is to measure the load power, and draw a low-pass-filtered version of that from the power delivery network, so that the battery provides the fast load power transients while the network provides the average power.

Figure 2:
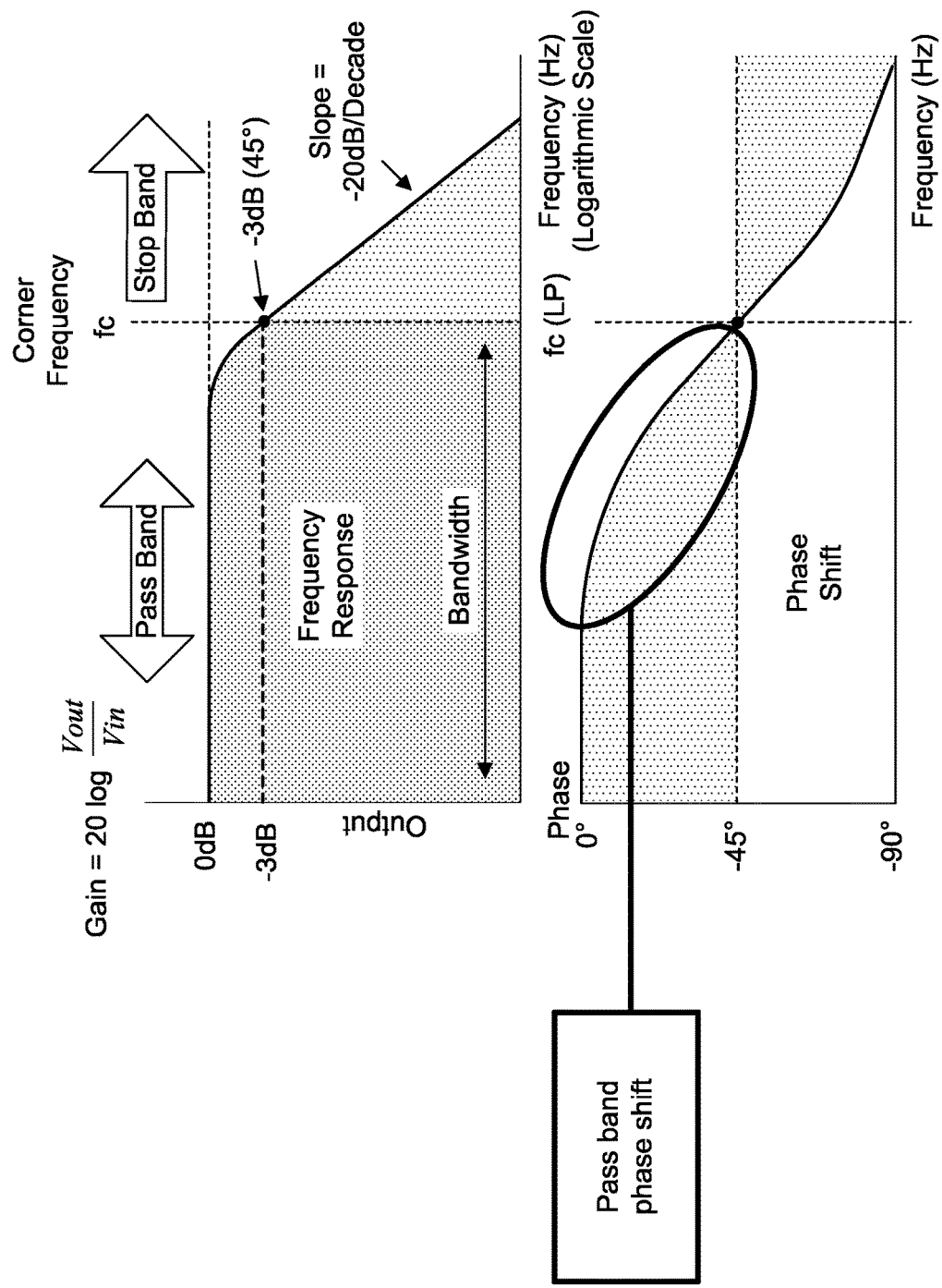
FIG. 2 illustrates a Bode plot showing the frequency response for an exemplary first-order low pass filter.

There is, however, a problem with conventional low-pass filters for this application. As an example, consider a simple first-order low pass filter. The frequency response of such a filter is shown in FIG. 2. FIG. 2 displays a Bode plot showing the frequency response for an example first-order low pass filter. Notice that the phase of the filter begins to drop off in the pass band, approximately one decade before the corner frequency $f_c$. In general, the characteristic of pass band phase shift is common among all causal filters. One notable exception is a high-Q second order filter, which has nearly zero phase shift to within a small neighborhood of the corner frequency. However, high-Q second orders necessarily also feature large resonance and consequently tend to amplify signal components around the resonant frequency and produce an oscillatory response that makes them unsuitable for applications like this.

By simple inspection of FIG. 1, one can see that, by power balance, $$P_{batt} = P_{load} - P_{line} \quad (1)$$

We are interested in controlling the frequency content of $P_{batt}$. Ideally $P_{batt}$ should contain only high frequency components of $P_{load}$, whereas low frequency components of $P_{load}$ should appear in $P_{line}$. Performing a Fourier transform of (1) and considering that, in the proposed approach, $P_{line}$ is simply equal to $P_{load}$ passed through a low pass filter with frequency response $H_{filt}(j\omega)$, we have the frequency domain relationship:

$$P_{batt}(j\omega) = P_{load}(j\omega) - P_{line}(j\omega) \quad (2)$$
$$= P_{load}(j\omega) - H_{filt}(j\omega)P_{load}(j\omega)$$
$$= P_{load}(j\omega)(1 - H_{filt}(j\omega))$$

Notice that $P_{batt}$ will have to provide components of the load power at any frequency for which $H_{filt}(j\omega) \neq 1$. Since the phase of the filter in FIG. 2 begins to drop off nearly a decade before the corner frequency, we can expect the battery will have to provide power at frequencies as low as $f_c/10$, even if $H_{filt}(j\omega)$ has unit amplitude (but not zero phase) at these frequencies. This is undesirable and mandates the use of a larger, more expensive battery.

Figure 3:
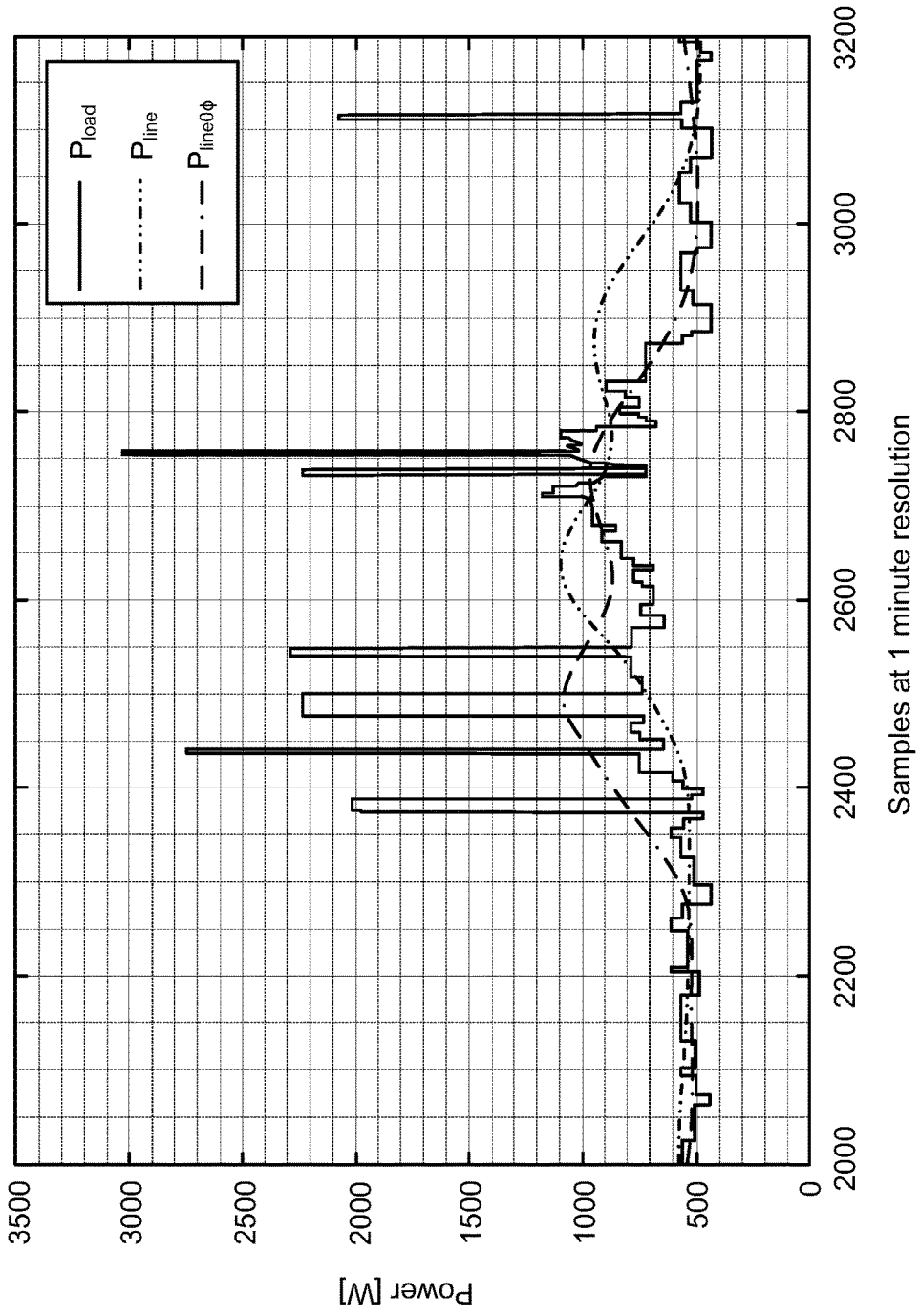
FIG. 3 illustrates how the phase shift of unattenuated frequencies creates a larger discrepancy between $P_{load}$ and $P_{line}$ which increases the strain on the battery.

This phenomenon can also be observed in time-domain waveforms. FIG. 3 shows a load profile with both high and low frequency components. FIG. 3 illustrates that phase shift of unattenuated frequencies creates a larger discrepancy between $P_{load}$ and $P_{line}$ which increases the strain on the battery. An improved filter output $P_{line0\varphi}$ would attenuate high frequencies without the added phase shift. As expected, high frequency components are rejected, but low frequency components in the passband are delayed by the phase shift, increasing the discrepancy between the $P_{line}$ and $P_{load}$. Notice that $P_{line}$ peaks significantly after $P_{load}$. An improved filter output $P_{line0\varphi}$ would attenuate high frequencies without the added phase shift.

Now the battery SoC is the running time-integral of the battery power, given by $$SoC(t) = SoC(0) + \frac{1}{E_{tot}} \int_0^t P_{batt}(t)dt \quad (3)$$

Looking again at sinusoidal Fourier components, we know that the integral of a sinusoid is another sinusoid whose amplitude is inversely proportional to angular frequency. That is, $$\int \cos(\omega t)dt = \frac{1}{\omega}\sin(\omega t) \quad (4)$$

Thus, it is evident that any low frequency components present in $P_{batt}(t)$—even those with a small amplitude—can have a significant effect on the SoC of the battery due to the $1/\omega$ gain. An improved filter which does not induce phase shift in frequencies below $f_c$ would result in significantly lower variation in SoC. This improved utilization could dramatically reduce the required battery size and increase the useful lifetime of the battery.

The previous discussion of conventional filters (such as the one in FIG. 2) made one reasonable but critical assumption—that the filter used for the application must be causal. In signal processing, a causal filter is one whose output depends only on past and present inputs. Contrarily, a noncausal filter is one whose output also depends on future inputs. For self-evident reasons, noncausal filter applications are typically limited to "offline" applications—i.e., post-processing applications in which the entire waveform subject to filtering is known before any filtering or signal processing takes place. A frequent application for noncausal filters is postprocessing of multimedia files after the media has been fully recorded.

One particular class of noncausal filters which would be ideally suited to this application (if it were realizable) is zero phase filters. Zero phase filters are able to amplify or attenuate the magnitude of certain frequencies while producing exactly zero phase distortion at all frequencies—both in the pass band and the stop band. They are characterized by an impulse response h[n] which is symmetrical around n=0. The most common implementation of a zero-phase filter is as shown in FIG. 4, and involves two filtering stages each followed by a "time reversal" where the order of the filtered signal is reversed.

Figure 4:
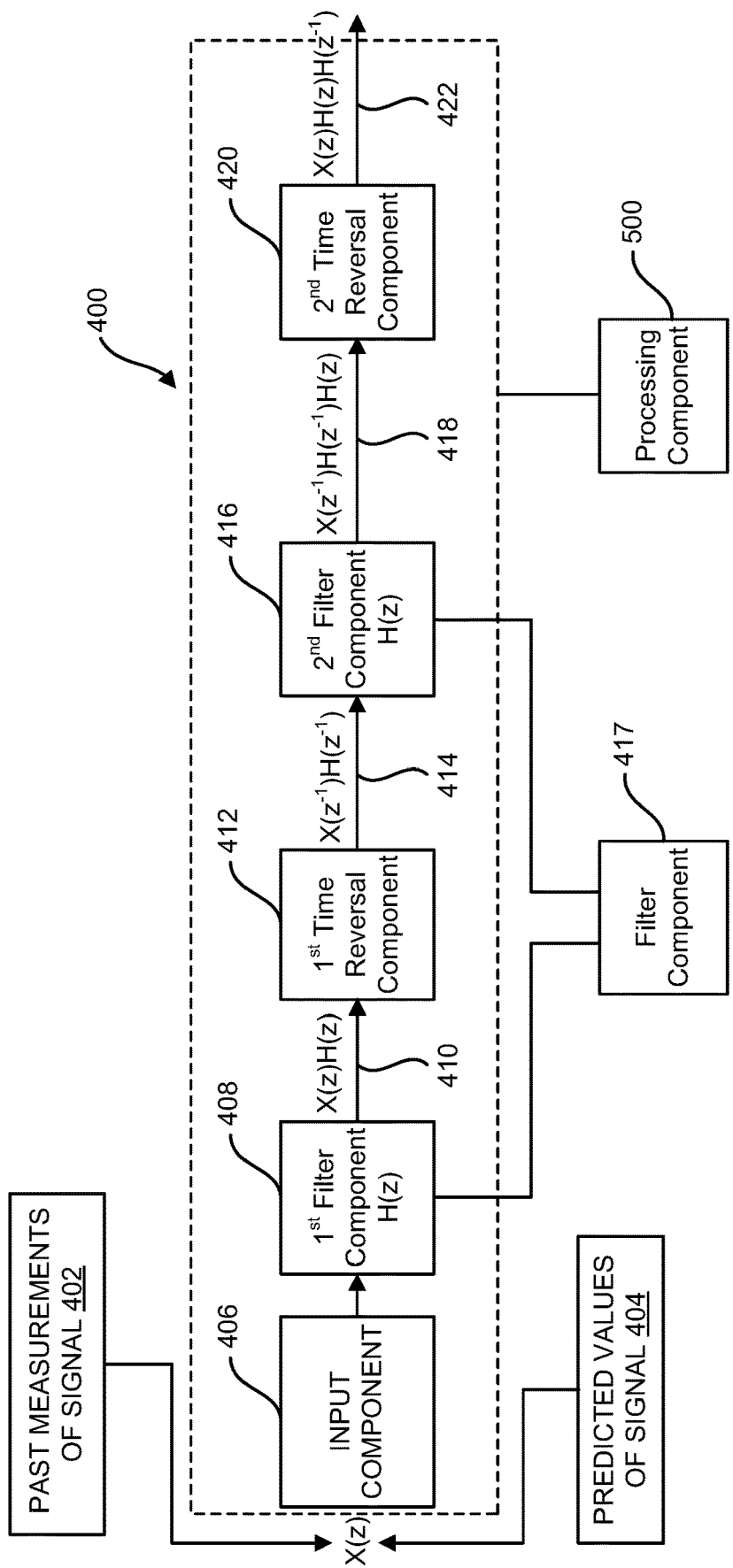
FIG. 4 illustrates an implementation of the present disclosure in a (noncausal) zero phase filter involving 4 steps: filtering, time reversal, a second filtering, and a second time reversal.

FIG. 4 illustrates an implementation of a (noncausal) zero phase filter 400 in accordance with an embodiment of the present disclosure. This implementation includes an initial step of obtaining past measurements of a signal 402 and predicting future values of the signal 404 to form an input signal 405. The input signal 405 (formed of the past measurements of the signal 402 and the predicted future values of the signal 404) are received by an input component 406 of the zero phase filter 400. In one embodiment, the predicted future values of the signal are obtained using machine learning methods. Zero phase filter 400 includes a first filter component 408 that performs a first filtering function of the input signal 405 resulting in a first filtered input signal 410. Zero phase filter 400 also includes a first time reversal component 412 that performs a first time reversal function on the first filtered input signal 410 resulting in a first time reversal input signal, 414. Zero phase filter 400 also includes a second filter component 416 that performs a second filtering function on the first time reversal input signal 414 resulting in a second filtered input signal 418. First filter component 408 and second filter component 416 are part of filtering component 417. Zero phase filter 400 also includes a second time reversal component 420 that performs a second time reversal function of the second filtered input signal 418 resulting in the output signal 422, the output signal 422 having a filtered waveform.

Thus, the methodology described above and shown in FIG. 4 uses the past measurements of the signal 402 and the predicted values of the signal 404 as components of input signal 405 in a noncausal zero-phase filtering algorithm for a zero-phase filter 400, the zero-phase filter 400 producing output signal 422, the output signal 422 having a filtered waveform. The overall result of this 4-step process is that the magnitude response $|H(e^{j\omega})|$ of the causal filter H(z) is squared, but the phase shift cancels and is exactly zero at all frequencies.

According to one embodiment of this disclosure, by recording the history of the load profile and also predicting the future waveforms (typically at least one filter time-constant in advance), zero-phase filtering can be performed online in real time. Any inaccuracies in the predicted portion of the waveform will lead to inaccuracies which degrade the performance of the filter, but preliminary research has shown that even very simple and relatively inaccurate predictions, when used in conjunction with the zero-phase filter, lead to better battery utilization and smaller SoC swings than traditional filtering could provide.

Many services are available and being developed that can help produce an accurate prediction of loads for several hours in advance, and the present disclosure is not limited to any particular type of prediction mechanism. Weather forecasts for temperature and solar irradiation provide a means for predicting PV generation and air conditioning electrical usage. Although each home is different, typical consumers have routines that create highly predictable load profiles. With the aid of machine learning algorithms and AI systems, each home's battery controller could adapt and tune its performance to fit their particular habits.

Although zero-phase filtering in theory requires the entire waveform to be known in advance (i.e., from the installation date to the end of time), in practice, the number of points needed for good performance varies with the cutoff frequency of the zero-phase filter. According to one embodiment of the present disclosure, optimal performance is obtained with samples in the time range $[-T_{window}:T_{window}]$, where $T_{window}$ is proportional to $1/f_c$ as in Equation (5) below, where k is a proportionality constant.

$$T_{window} = \frac{k}{f_c} \quad (5)$$

According to one embodiment of the present disclosure, at each iteration, the predictive zero-phase filter uses measurements in the time range $[-T_{window}:0]$, and predicted values in the time range $[0:T_{window}]$, performs the zero-phase filtering routine shown in FIG. 4, and updates the output by selecting the single value of the filtered waveform which corresponds to the current time. This implementation can be performed by the processing component or module illustrated in FIG. 5.

Figure 5:
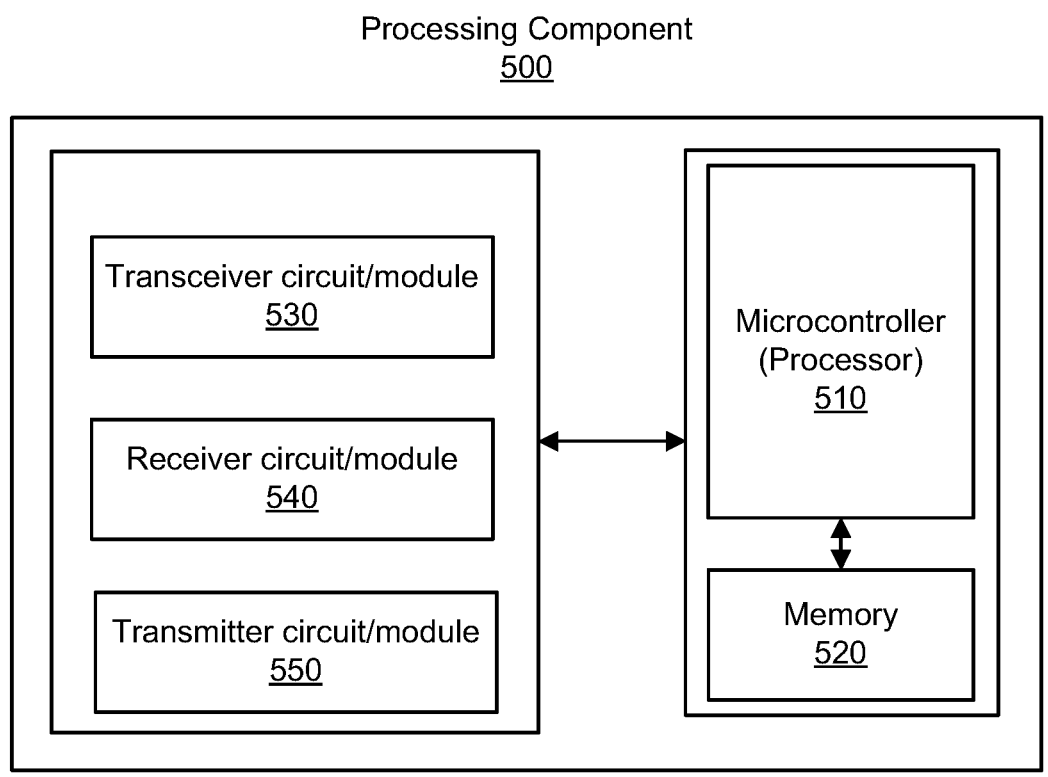
FIG. 5 illustrates an exemplary processing component configured to perform the functions discussed in the present disclosure.

FIG. 5 illustrates an exemplary processing module or component 400 that is configured to perform the functions described herein. Specifically, processing component 500 comprises a processing circuit or a processing module or a processor 510; a memory module 520; a receiver circuit or receiver module 540; a transmitter circuit or transmitter module 550; and a transceiver circuit or transceiver module 530 which may include the transmitter circuit 550 and the receiver circuit 540.

The processing module/circuit 510 includes a processor, microprocessor, an application specific integrated circuit (ASIC), field programmable gate array (FPGA), or the like, and may be referred to as the "processor 510." Memory (circuit or module) 520 includes a random-access memory (RAM), a read only memory (ROM), and/or another type of memory to store data and instructions that may be used by processor 510.

Processor 510 is configured to execute computer program instructions from a computer program stored in a non-transitory computer-readable medium that is in or is accessible to the processing circuitry. Here, "non-transitory" does not necessarily mean permanent or unchanging storage, and may include storage in working or volatile memory, but the term does connote storage of at least some persistence. The execution of the program instructions stored in memory 520 specially adapts or configures the processor 510 to carry out the operations of processing component 500 disclosed herein.

Figure 6:
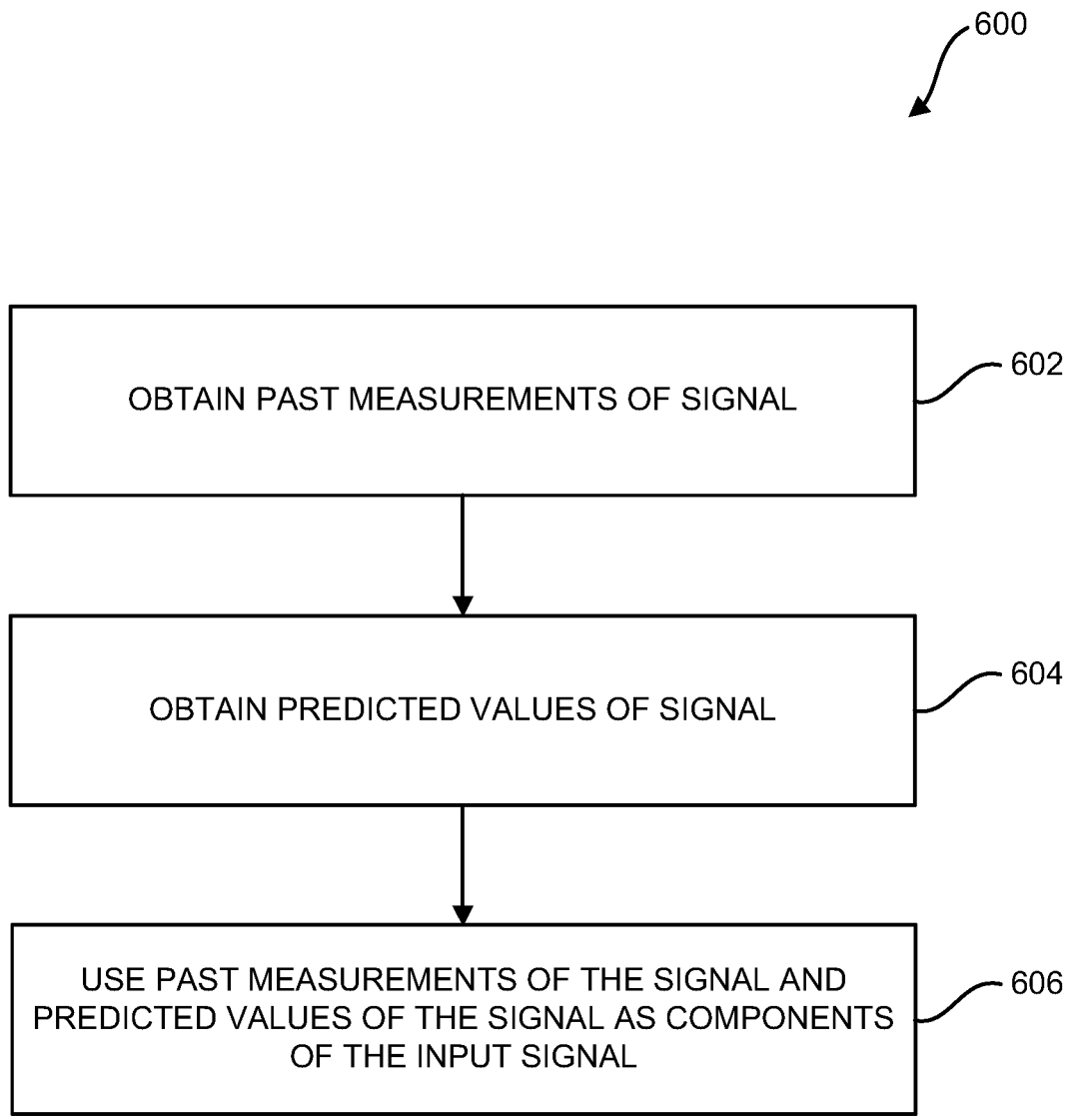
FIG. 6 illustrates a flowchart showing an exemplary process performed by the present disclosure.

FIG. 6 illustrates a flowchart, which shows an exemplary process 600 of the present disclosure, performed by processor 510 of processing component 500. In this embodiment, processor 510 is configured to obtain past measurements of a signal, at step 602, obtain predicted values of the signal, at step 604, and use the obtained past measurements of the signal and the obtain predicted values of the signal at components of an input signal to a zero-phase filter 400.

Simulation Validation

To verify the benefits of the predictive zero-phase filtering approach, three different filters were simulated in a controller for the example application of FIG. 1. The simulated controller sets the power $P_{line}$ drawn by the controllable power converter equal to a sum of two quantities: a low-pass filtered version of the load power $P_{load}$, and the output of a simple proportional compensator which regulates the battery state of charge to a fixed reference. This control is shown in FIG. 7.

Figure 7:
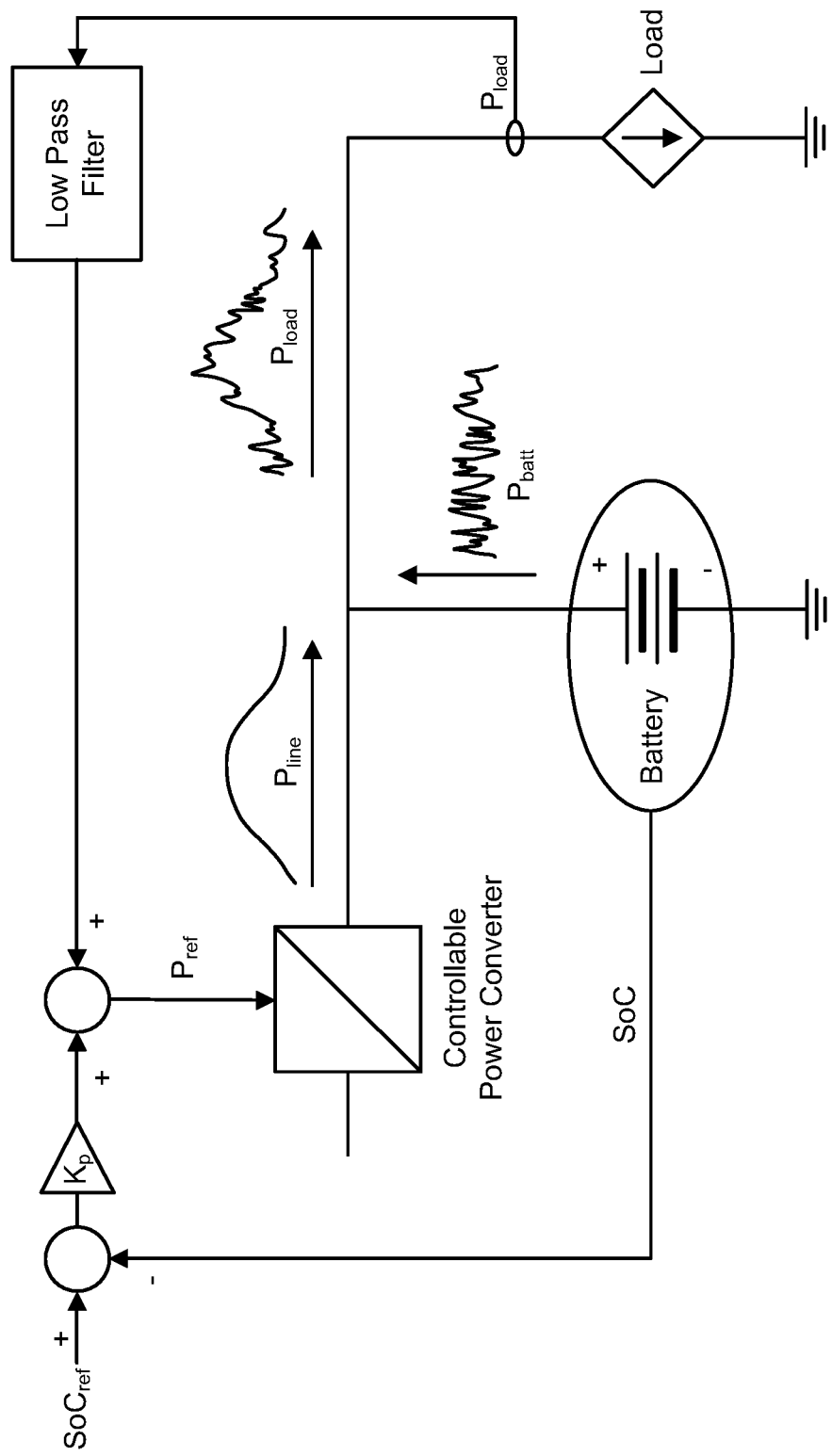
FIG. 7 illustrates how the load smoothing application is simulated with the control algorithm.

FIG. 7 illustrates the load smoothing application is simulated with the control algorithm shown in grey. The low pass filter is implemented in several ways for performance comparison. The system of FIG. 7 was simulated with three different low pass filters: (1) an ideal, noncausal zero-phase filter (which would not be realizable in a real application); (2) an extremely simple form of the predictive zero-phase filter, where the "prediction" just uses the measured load values from the same time of the previous day; and (3) a normal, causal filter which induces phase shift.

Each filter was tuned for a time constant of 5 hours. That is, $$f_c = \frac{1}{\tau} = \frac{1}{5 \text{ hours}} = 55.6 \text{ }\mu Hz \text{ and } 80 \text{ dB}/dec$$

of stopband attenuation. The simulation considers a three-day load profile. Both the battery initial condition and the reference for the SoC proportional compensator were set to 60%. The load profile and resulting waveforms $P_{line}$ and SoC waveforms for each of the three tested filters are shown in FIG. 8.

Figure 8:
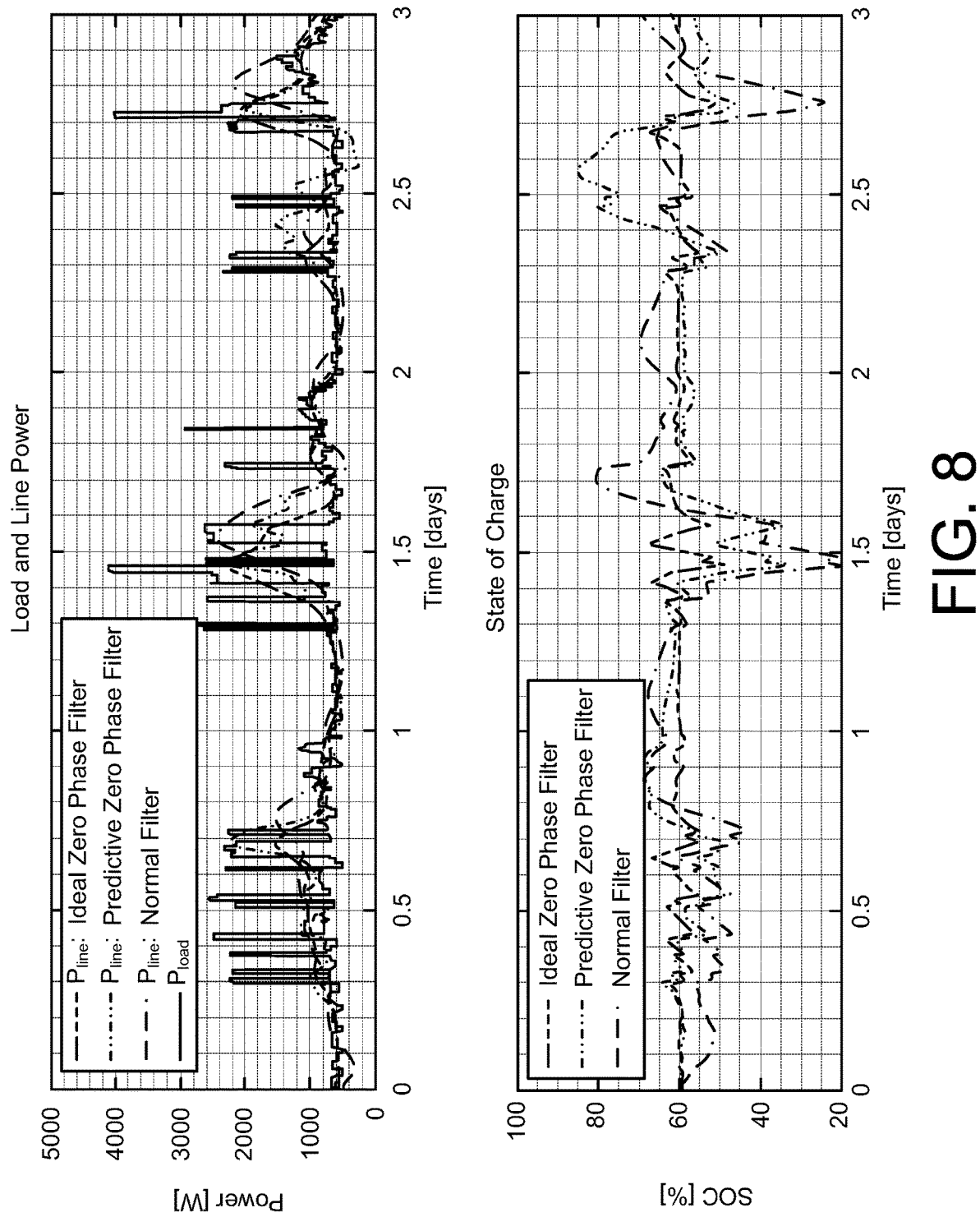
FIG. 8 illustrates how simulation results show line power and battery state of charge for each of the three filter types.

FIG. 8 illustrates simulation results that show line power and battery state of charge for each of the three filter types. All three filters provide good filtering of the $P_{load}$ waveform, so that in each case $P_{line}$ is smoother than $P_{load}$, has lower peak values, and lacks the large, fast power transients present in the instantaneous load profile. Looking at the SoC waveforms, however, there is a significant discrepancy. The best performance clearly comes from the ideal zero-phase filter, which keeps the SoC in within 10% of the reference at all times. The normal filter performs much worse, clipping all the way down to 20% state of charge and rising as high as 80%. This corresponds to a [−40%:+20%] band around the reference. The predictive zero phase filter does not perform as well as the ideal zero phase, but does perform slightly better than the normal filter, keeping the SoC within 25% of the reference at all times. It is worth reemphasizing that the prediction method used was among the simplest possible techniques: simply using the previous day's data. This method could undoubtedly be improved on with more sophisticated prediction techniques. Advanced solutions for predicting the load may involve machine learning algorithms and could potentially take a large number of inputs from "smart home" compatible appliances and other networked devices in modern homes. As the prediction improves and gets closer to reality, the performance of the predictive zero phase filter approaches that of the ideal zero phase filter, leading to even more significant value added by the algorithm. Thus, this present disclosure is not limited in any way to a specific type of prediction method.

The current disclosure provides a novel algorithm for filtering waveforms (i.e., selecting and isolating frequency content in real time) without phase distortion or phase delays. In accordance with one embodiment of the present disclosure, the concept of the algorithm is to combine noncausal filtering techniques with a prediction of future values of the waveform which is being filtered. This prediction allows the noncausal filtering techniques to be used in online applications, such as realtime controllers. Simulation results suggest that even with extremely simple, inaccurate prediction techniques, the algorithm can provide better performance in some applications than traditional causal filters could. Better prediction techniques lead to even better performance gains over traditional filters.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art using the teachings disclosed herein.

What is claimed is:

1. A method of separating and selecting frequency components of a signal in real time without phase delay using a zero-phase filter, comprising:
    obtaining past measurements of the signal;
    obtaining predicted values of the signal; and
    using the predicted values of the signal and the past measurements of the signal as components of an input signal in a noncausal zero-phase filtering algorithm for a zero-phase filter, the zero-phase filter producing an output signal, the output signal having a filtered waveform with zero phase delay capable of being used for an online application.

2. The method of claim 1, wherein the predicted values of the signal are obtained using machine learning methods.

3. The method of claim 1, further comprising sampling the signal in a time range from $-T_{window}$ to $T_{window}$ where $T_0$ is the present time and $T_{window}$ is related to an inverse of a cutoff frequency of the zero-phase filter.

4. The method of claim 3, wherein obtaining past measurements of the signal includes sampling the signal between a first time instant $-T_{window}$ and a second time instant $T_0$, and obtaining predicted values of the signal in the time range between the second time instant $T_0$ and a third time instant $T_{window}$.

5. The method of claim 4, further comprising performing, by the zero phase filter, a first filtering function on the input signal resulting in a first filtered input signal, performing a first time reversal function on the first filtered input signal resulting in a first time reversal input signal, performing a second filtering function on the first time reversal input signal resulting in a second filtered input signal, and performing a second time reversal function of the second filtered input signal resulting in the output signal, the resulting output signal being a filtered waveform.

6. The method of claim 5, further comprising updating the output signal by selecting a single value of the filtered waveform and isolating frequency content in real time.

7. An apparatus for separating and selecting frequency components of an input signal in real time without phase delay, the apparatus comprising:
    a zero-phase filter, the filter comprising:
        an input component for receiving the input signal;
        a filtering component; and
        a time reversal component; and
    a processing component configured to:
        obtain past measurements of a signal;
        obtain predicted values of the signal; and
        use the predicted values of the signal and the past measurements of the signal as components of the input signal to the filtering component, the filtering component producing an output signal, the output signal having a filtered waveform with zero phase delay capable of being used for an online application.

8. The apparatus of claim 7, wherein the predicted values of the signal are obtained using machine learning methods.

9. The apparatus of claim 7, wherein the processing component is further configured to sample the input signal in a time range from $-T_{window}$ to $T_{window}$ where $T_0$ is the present time and $T_{window}$ is related to an inverse of a cutoff frequency of the filtering component.

10. The apparatus of claim 9, wherein obtaining past measurements of the signal includes sampling the signal between a first time instant $-T_{window}$ and a second time instant $T_0$, and obtaining predicted values of the signal in the time range between the second time instant $T_0$ and a third time instant $T_{window}$.

11. The apparatus of claim 10, wherein the filtering component comprises a first filtering component and a second filtering component, and the time reversal component comprises a first time reversal component and a second time reversal component, wherein:
    the first filtering component is configured to perform a first filtering function on the input signal resulting in a first filtered input signal;
    the first time reversal component is configured to perform a first time reversal function on the first filtered input signal resulting in a first time reversal input signal;
    the second filtering component is configured to perform a second filtering function on the first time reversal input signal resulting in a second filtered input signal; and
    the second time reversal component is configured to perform a second time reversal function of the second filtered input signal resulting in the output signal, the output signal having a filtered waveform.

12. The apparatus of claim 11, wherein the processing component is further configured to update the output signal by selecting a single value of the filtered waveform and isolating frequency content in real time.

13. A non-transitory computer-readable storage medium having stored therein instructions which, when executed by a processor, cause the processor to separate and select frequency components of a signal in real time without phase delay using a zero-phase filter, the processor further configured to perform operations comprising:
    obtaining past measurements of the signal;
    obtaining predicted values of the signal; and
    using the predicted values of the signal and the past measurements of the signal as components of an input signal in a noncausal zero-phase filtering algorithm for a zero-phase filter, the zero-phase filter producing an output signal, the output signal having a filtered waveform with zero phase delay capable of being used for an online application.

14. The non-transitory computer-readable storage medium of claim 13, wherein the predicted values of the signal are obtained using machine learning methods.

15. The non-transitory computer-readable storage medium of claim 13, wherein the processor is further configured to sample the signal in a time range from $-T_{window}$ to $T_{window}$ where $T_0$ is the present time and $T_{window}$ is related to an inverse of a cutoff frequency of the zero-phase filter.

16. The non-transitory computer-readable storage medium of claim 15, wherein obtaining past measurements of the signal includes sampling the signal between a first time instant $-T_{window}$ and a second time instant $T_0$, and obtaining predicted values of the signal in the time range between the second time instant $T_0$ and a third time instant $T_{window}$.

* * * * *